(12) United States Patent
Tsao et al.

(10) Patent No.: US 9,978,716 B2
(45) Date of Patent: May 22, 2018

(54) PACKAGE STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Chih-Chiang Tsao, Taoyuan (TW); Hsiu-Jen Lin, Hsinchu County (TW); Chun-Cheng Lin, New Taipei (TW); Chih-Wei Lin, Hsinchu County (TW); Ming-Da Cheng, Hsinchu County (TW); Ching-Hua Hsieh, Hsinchu (TW); Chung-Shi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/237,428

(22) Filed: Aug. 15, 2016

(65) Prior Publication Data
US 2017/0317054 A1    Nov. 2, 2017

Related U.S. Application Data

(60) Provisional application No. 62/330,749, filed on May 2, 2016.

(51) Int. Cl.
*H01L 23/48* (2006.01)
*H01L 25/065* (2006.01)
(Continued)

(52) U.S. Cl.
CPC ........ *H01L 25/0652* (2013.01); *H01L 21/486* (2013.01); *H01L 21/50* (2013.01); *H01L 21/563* (2013.01); *H01L 21/6835* (2013.01); *H01L 21/6836* (2013.01); *H01L 24/02* (2013.01); *H01L 25/0657* (2013.01); *H01L 25/50* (2013.01); *H01L 2021/6003* (2013.01); *H01L 2021/6009* (2013.01); *H01L 2021/60052* (2013.01); *H01L 2021/60247* (2013.01); *H01L 2021/60255* (2013.01); *H01L 2221/68331* (2013.01); *H01L 2221/68359* (2013.01); *H01L 2221/68368* (2013.01); *H01L 2221/68372* (2013.01); *H01L 2224/02331* (2013.01);
(Continued)

(58) Field of Classification Search
CPC ....... H01L 2924/01079; H01L 23/2226; H01L 23/481; H01L 2924/01029; H01L 25/0652; H01L 21/486; H01L 25/657; H01L 25/50; H01L 2021/6003; H01L 2224/02579
USPC ........ 257/774, 686, 777, 787, 789; 438/629, 438/108, 637, 124
See application file for complete search history.

(56) References Cited

U.S. PATENT DOCUMENTS 9,490,195 B1 * 11/2016 Prabhu .............. H01L 23/49575
2011/0095418 A1 * 4/2011 Lim .................... H01L 23/3128
257/737
(Continued)

*Primary Examiner* — Thinh T Nguyen
(74) *Attorney, Agent, or Firm* — Maschoff Brennan

(57) ABSTRACT

A package structure includes a molding material, at least one through-via, at least one conductor, at least one dummy structure and an underfill. The through-via extends through the molding material. The conductor is present on the through-via. The dummy structure is present on the molding material and includes a dielectric material. The underfill is at least partially present between the conductor and the dummy structure.

20 Claims, 20 Drawing Sheets

(51) Int. Cl.
  *H01L 21/48*   (2006.01)
  *H01L 21/50*   (2006.01)
  *H01L 21/56*   (2006.01)
  *H01L 21/683*   (2006.01)
  *H01L 23/00*   (2006.01)
  *H01L 25/00*   (2006.01)
  H01L 21/60   (2006.01)

(52) U.S. Cl.
  CPC ............... *H01L 2224/02373* (2013.01); *H01L 2224/02379* (2013.01); *H01L 2225/06517* (2013.01); *H01L 2225/06548* (2013.01); *H01L 2225/06568* (2013.01)

(56) References Cited

U.S. PATENT DOCUMENTS

| | | | | |
|---|---|---|---|---|
| 2011/0272820 | A1* | 11/2011 | Lee | H01L 21/561 |
| | | | | 257/774 |
| 2012/0098123 | A1* | 4/2012 | Yu | H01L 21/563 |
| | | | | 257/737 |
| 2014/0231984 | A1* | 8/2014 | Chen | H01L 23/3128 |
| | | | | 257/737 |
| 2014/0328104 | A1* | 11/2014 | Jeon | G11C 5/025 |
| | | | | 365/63 |

* cited by examiner

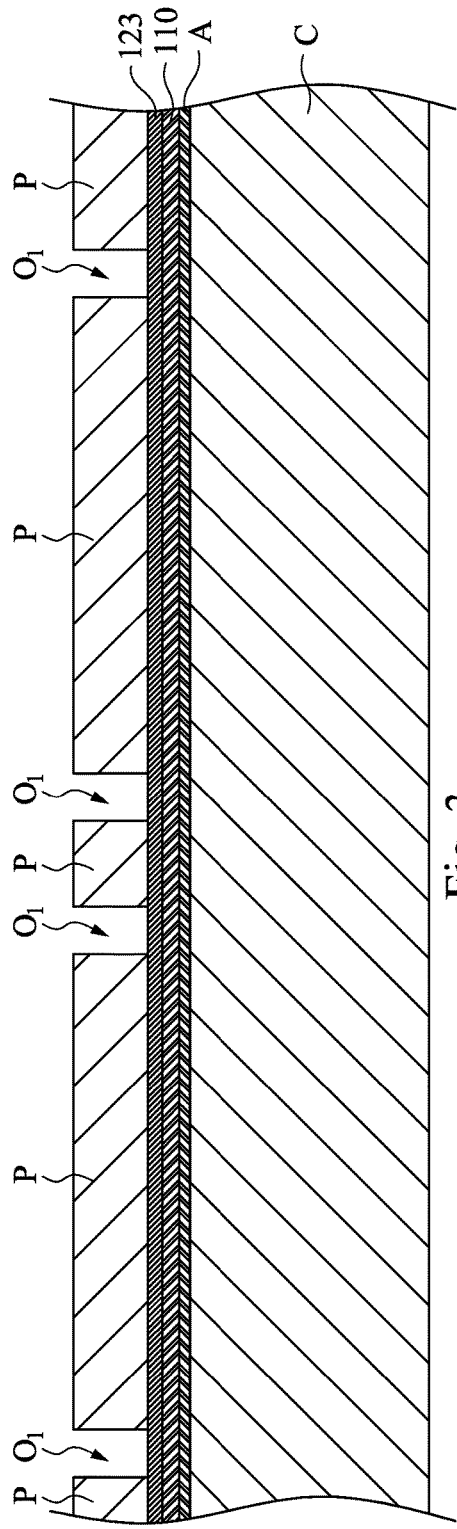
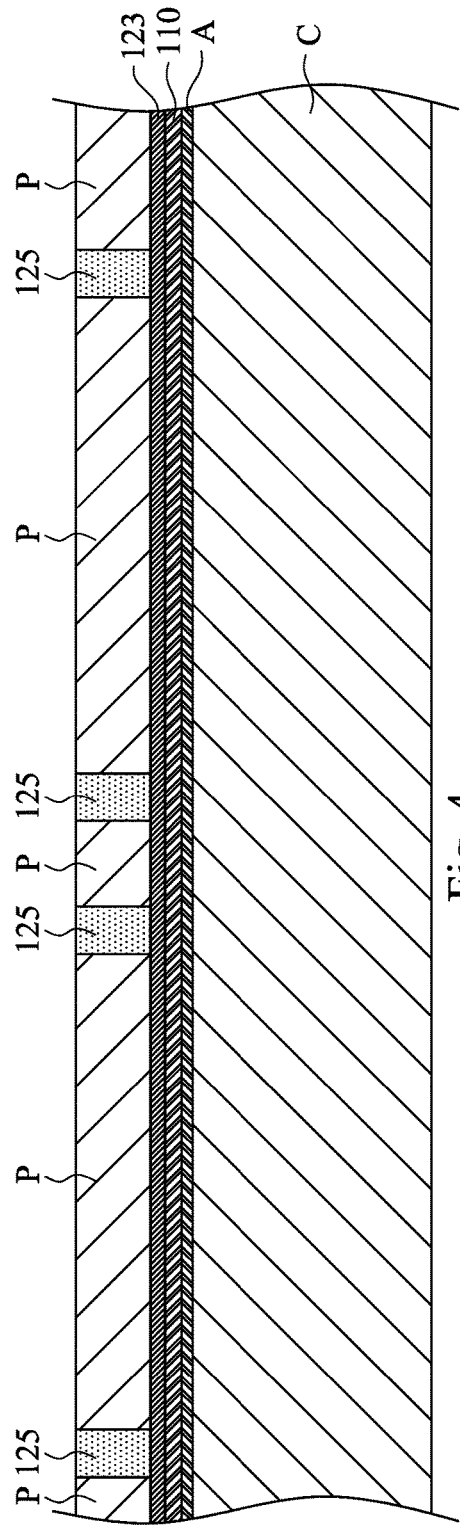
Fig. 3
Fig. 4

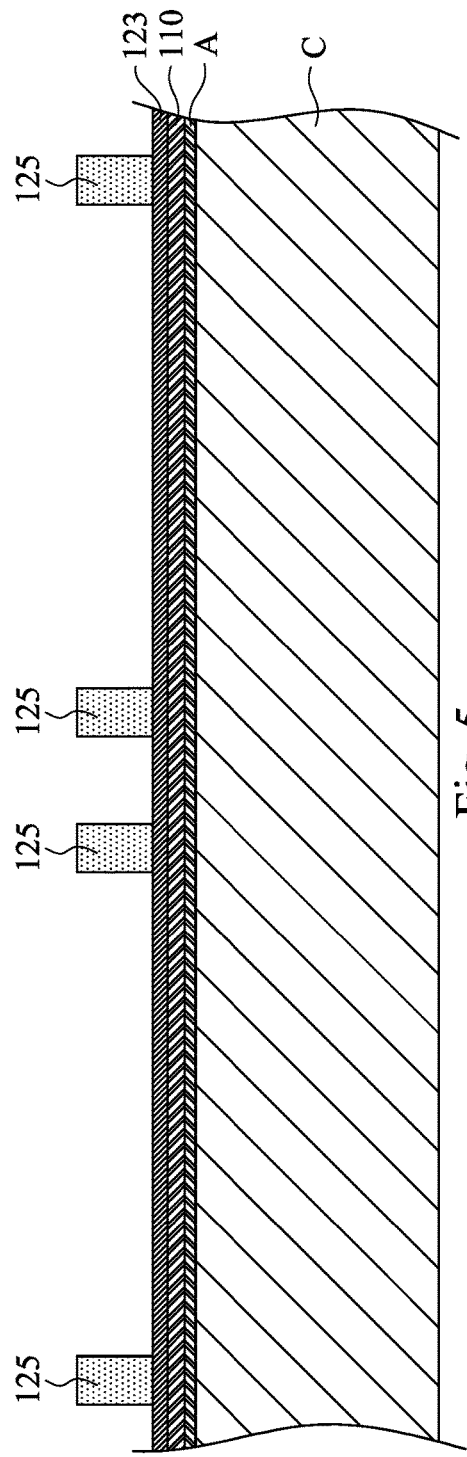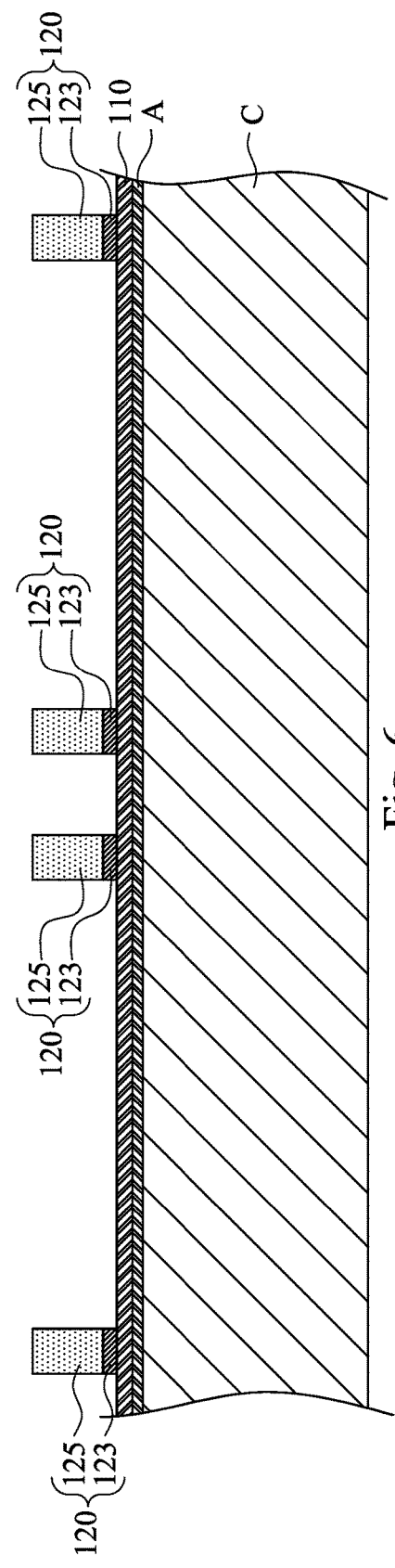

PACKAGE STRUCTURE AND METHOD FOR MANUFACTURING THE SAME

RELATED APPLICATIONS

This application claims priority to U.S. Application Ser. No. 62/330,749, filed May 2, 2016, which is herein incorporated by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components are also equipped with smaller packages in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bump-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-20 are cross-sectional views of intermediate stages in the manufacturing of a package structure in accordance with some embodiments of the present disclosure.

DETAILED DESCRIPTION

Figure 1:
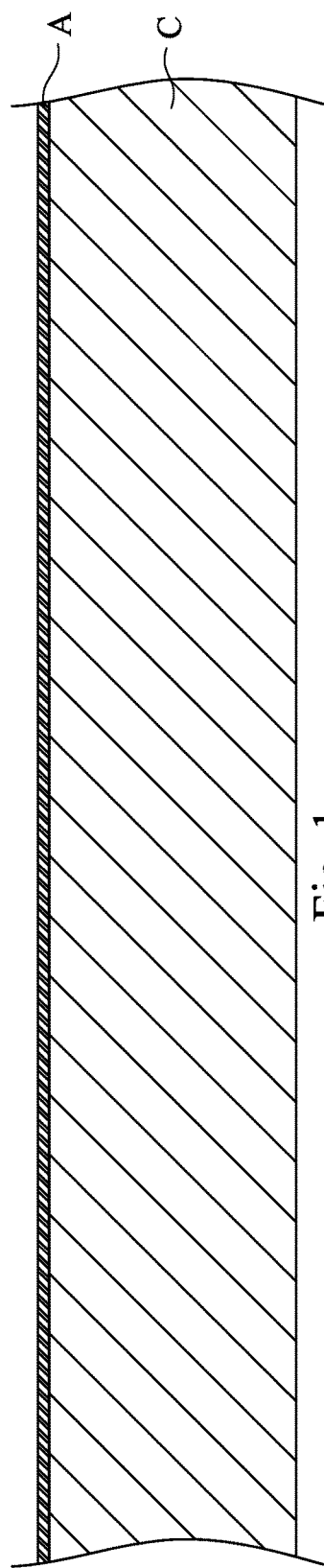

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-20 are cross-sectional views of intermediate stages in the manufacturing of a package structure in accordance with some embodiments of the present disclosure. Referring to FIG. 1, an adhesive layer A is formed on a carrier C. The carrier C may be a blank glass carrier, a blank ceramic carrier, or the like. The adhesive layer A may be made of an adhesive, such as ultra-violet (UV) glue, light-to-heat conversion (LTHC) glue, or the like, although other types of adhesives may be used.

Figure 2:
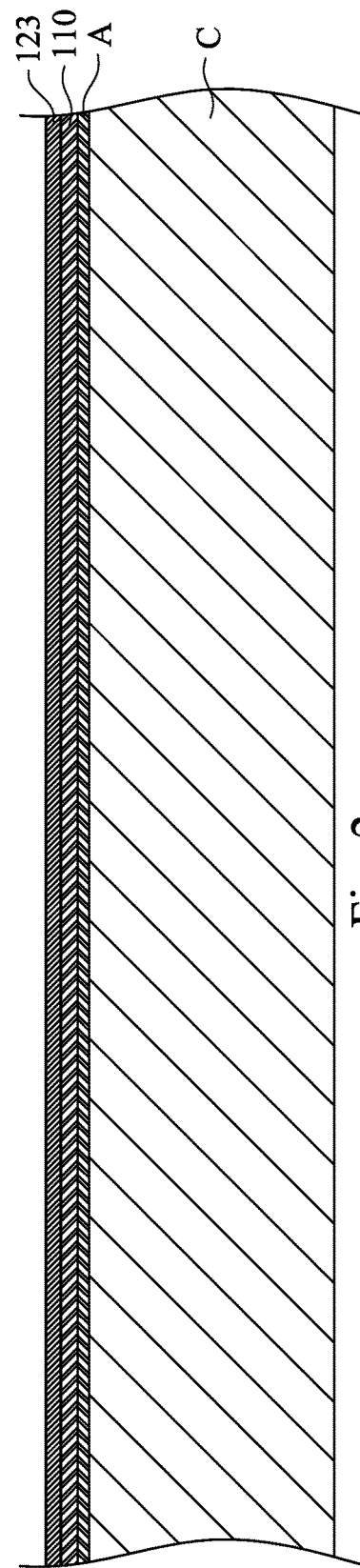

Referring to FIG. 2, a buffer layer 110 is formed over the adhesive layer A. The buffer layer 110 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 110 is a substantially planar layer having a substantially uniform thickness, in which the thickness may be greater than about 2 μm, and may be in a range from about 2 μm to about 40 μm. In some embodiments, top and bottom surfaces of the buffer layer 110 are also substantially planar.

A seed layer 123 is formed on the buffer layer 110, for example, through physical vapor deposition (PVD) or metal foil laminating. The seed layer 123 may include copper, copper alloy, aluminum, titanium, titanium alloy, or combinations thereof. In some embodiments, the seed layer 123 includes a titanium layer and a copper layer over the titanium layer. In alternative embodiments, the seed layer 123 is a copper layer.

Referring to FIG. 3, a photo resist P is applied over the seed layer 123 and is then patterned. As a result, openings $O_1$ are formed in the photo resist P, through which some portions of the seed layer 123 are exposed.

As shown in FIG. 4, conductive features 125 are formed in the photo resist P through plating, which may be electro plating or electro-less plating. The conductive features 125 are plated on the exposed portions of the seed layer 123. The conductive features 125 may include copper, aluminum, tungsten, nickel, solder, or alloys thereof. Top-view shapes of the conductive features 125 may be rectangles, squares, circles, or the like. Heights of the conductive features 125 are determined by the thickness of the subsequently placed device dies 130 (FIG. 7), with the heights of the conductive features 125 greater than the thickness of the device dies 130 in some embodiments of the present disclosure. After the plating of the conductive features 125, the photo resist P is removed, and the resulting structure is shown in FIG. 5. After the photo resist P is removed, some portions of the seed layer 123 are exposed.

Referring to FIG. 6, an etch step is carried out to remove the exposed portions of the seed layer 123, in which the etch step may include an anisotropic etching. Some portions of the seed layer 123 that are covered by the conductive features 125, on the other hand, remain not etched. Throughout the description, the conductive features 125 and the remaining underlying portions of the seed layer 123 are in combination referred to as through integrated fan-out (InFO) vias (TIVs) 120, which are also referred to as through-vias 120. Although the seed layer 123 is shown as a layer separate from the conductive features 125, when the seed layer 123 is made of a material similar to or substantially the same as the respective overlying conductive features 125, the seed layer 123 may be merged with the conductive features 125 with no distinguishable interface therebetween. In alternative embodiments, there exist distinguishable interfaces between the seed layer 123 and the overlying conductive features 125.

Figure 7:
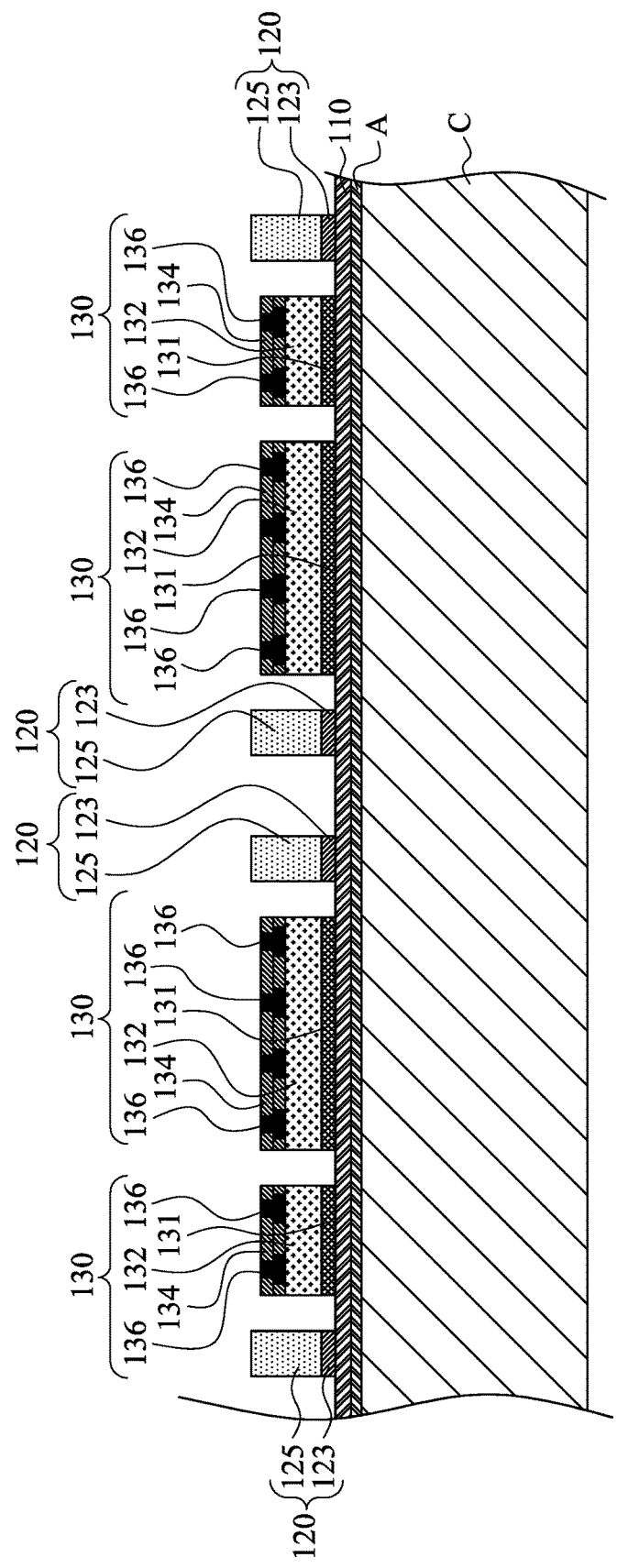

FIG. 7 illustrates placement of device dies 130 over the buffer layer 110. The device dies 130 may be adhered to the buffer layer 110 through adhesive layers 131. The device dies 130 may be logic device dies including logic transistors therein. In some exemplary embodiments, the device dies 130 may be central computing unit (CPU) dies, power management integrated circuit (PMIC) dies, transceiver (TRX) dies, or the like. Each of the device dies 130 includes a semiconductor substrate 132 (a silicon substrate, for example) that contacts the adhesive layer 131, in which the back surface of the semiconductor substrate 132 is in contact with the adhesive layer 131.

In some exemplary embodiments, conductive pillars 136 (such as copper posts) are formed as the top portions of the device dies 130, and are electrically coupled to the subsidiary devices such as transistors (not shown) in the device dies 130. In some embodiments, a dielectric layer 134 is formed on the top surface of the respective device die 130, with the conductive pillars 136 having at least lower portions in the dielectric layer 134. The top surfaces of the conductive pillars 136 may be substantially level with the top surfaces of the dielectric layers 134 in some embodiments. Alternatively, the dielectric layers are not formed, and the conductive pillars 136 protrude from a top dielectric layer (not shown) of the respective device dies 130.

Figure 8:
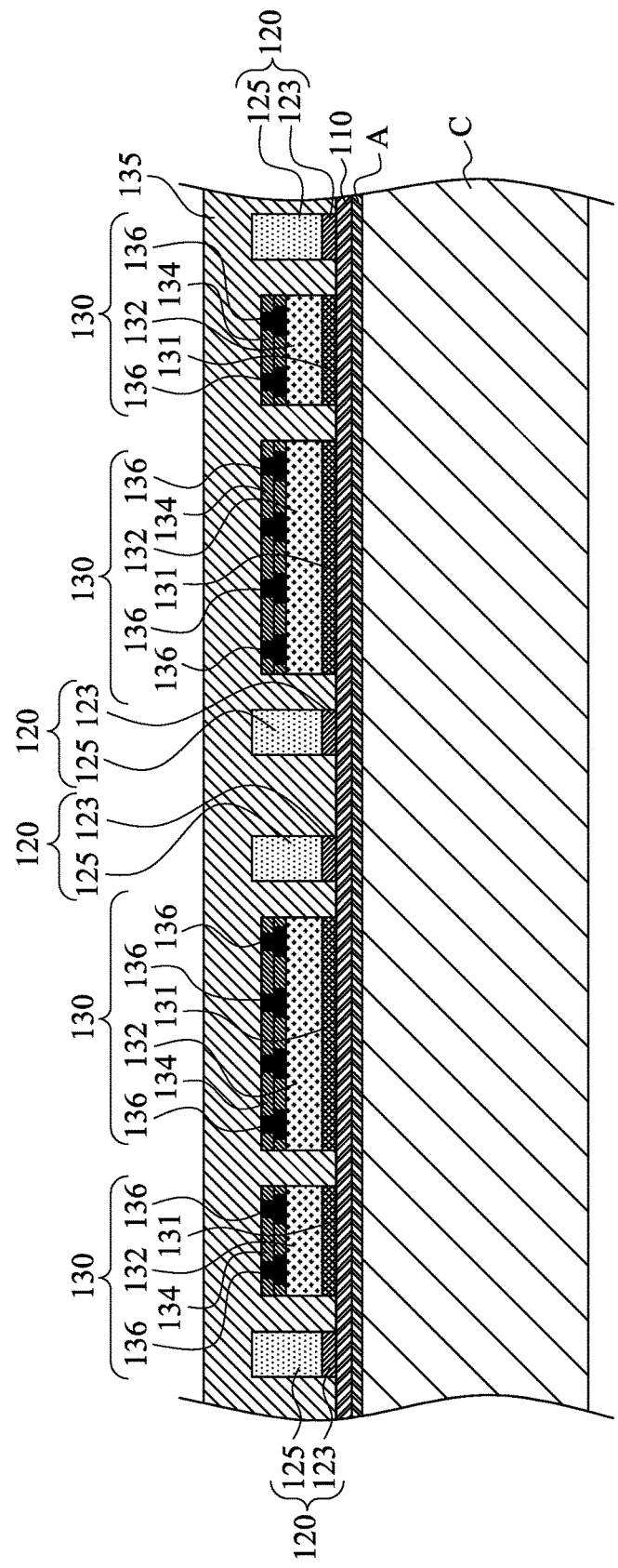

Referring to FIG. 8, a molding material 135 is molded on the device dies 130 and the TIVs 120. The molding material 135 fills gaps between the device dies 130 and the TIVs 120, and may be in contact with the buffer layer 110. In addition, the molding material 135 is filled into gaps between the conductive pillars 136 when the conductive pillars 136 are protruding conductive pillars (this arrangement is not shown). The top surface of the molding material 135 is higher than the top ends of the conductive pillars 136 and the TIVs 120.

In some embodiments, the molding material 135 includes a polymer-based material. The term "polymer" can represent thermosetting polymers, thermoplastic polymers, or combinations thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combinations thereof.

Figure 9:
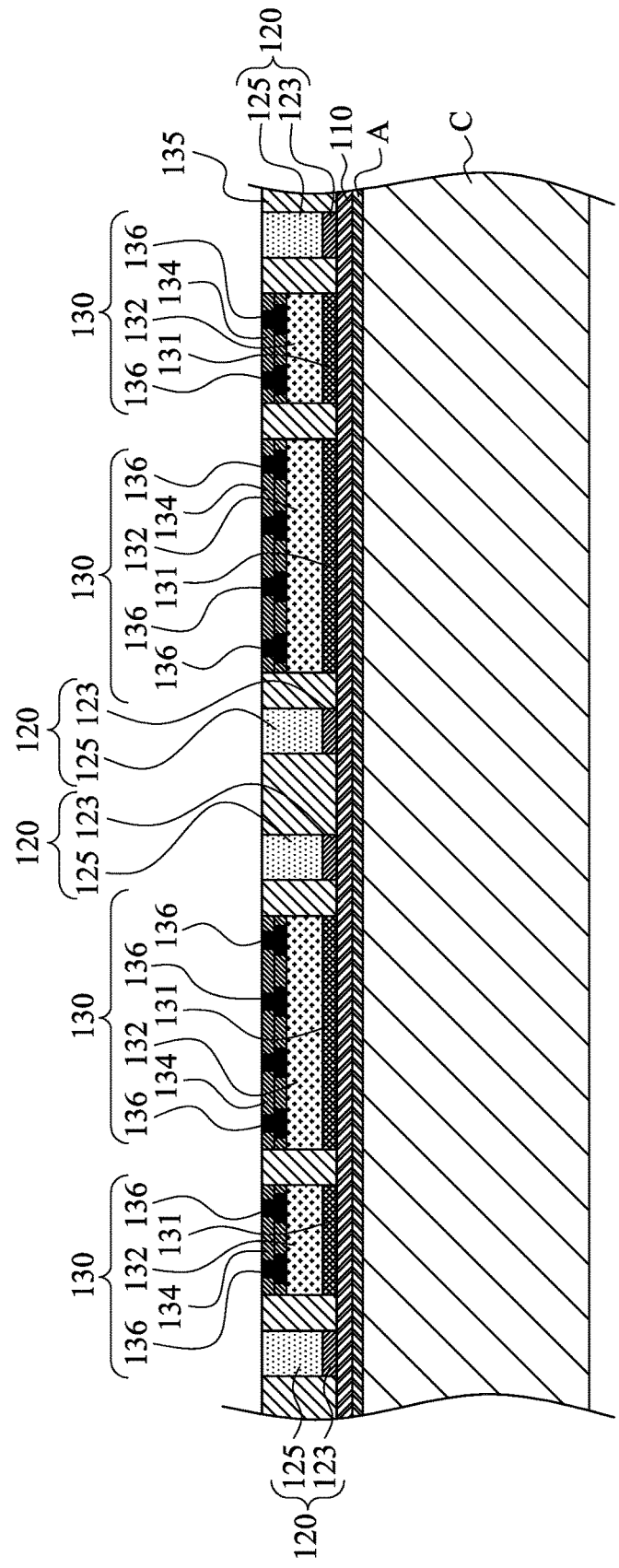

Next, a grinding step is carried out to thin the molding material 135, until the conductive pillars 136 and the TIVs 120 are exposed. The resulting structure is shown in FIG. 9, in which the molding material 135 is in contact with sidewalls of the device dies 130 and the TIVs 120. Due to the grinding, the top ends of the TIVs 120 are substantially level (coplanar) with the top ends of the conductive pillars 136, and are substantially level (coplanar) with the top surface of the molding material 135. As a result of the grinding, conductive residues such as metal particles may be generated, and left on the top surface of the structure shown in FIG. 9. Accordingly, after the grinding, a cleaning may be carried out, for example, through a wet etching, so that the conductive residues are removed.

Figure 10:
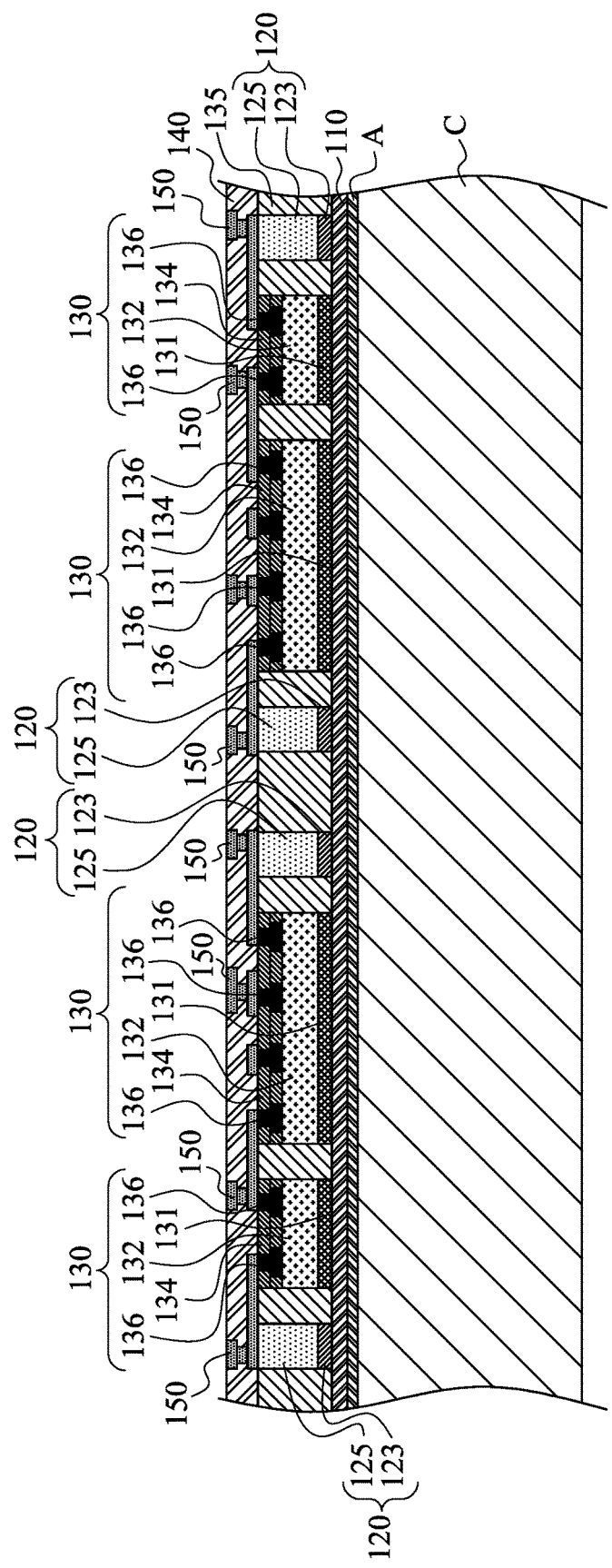

Next, referring to FIG. 10, redistribution lines (RDLs) 150 are formed over the molding material 135 to connect to the conductive pillars 136 and the TIVs 120. The RDLs 150 may also interconnect the conductive pillars 136 and the TIVs 120. In accordance with various embodiments, one or a plurality of dielectric layers 140 are formed over the device dies 130, the molding material 135 and the TIVs 120, with the RDLs 150 formed in the dielectric layers 140. In some embodiments, the formation of one layer of the RDLs 150 includes forming a blanket copper seed layer, forming and patterning a mask layer over the blanket copper seed layer, performing a plating to form the RDLs 150, removing the mask layer, and performing a flash etching to remove the portions of the blanket copper seed layer not covered by the RDLs 150. In alternative embodiments, the RDLs 150 are formed by depositing metal layers, patterning the metal layers, and filling gaps between the RDLs 150 with the dielectric layers 140. The RDLs 150 may include a metal or a metal alloy including aluminum, copper, tungsten, and/or alloys thereof.

FIG. 10 illustrates two layers of the RDLs 150, while there may be one or more than two layers of the RDLs 150, depending on the routing design of the respective package. The dielectric layers 140 in these embodiments may include a polymer such as polyimide, benzocyclobutene (BCB), polybenzoxazole (PBO), or the like. Alternatively, the dielectric layers 140 may include inorganic dielectric materials such as silicon oxide, silicon nitride, silicon carbide, silicon oxynitride, or the like.

Figure 11:
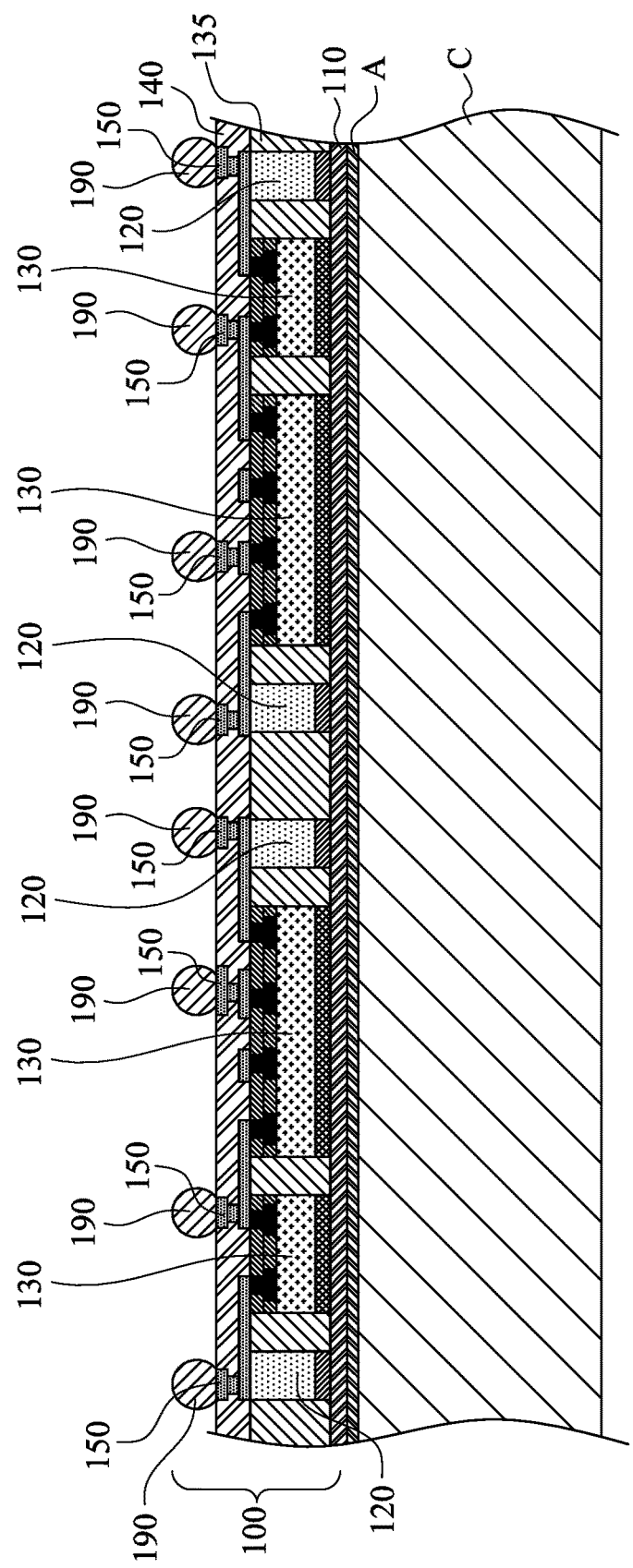

FIG. 11 illustrates formation of electrical connectors 190 in accordance with some exemplary embodiments. The formation of the electrical connectors 190 may include placing solder balls on the exposed portions of the RDLs 150 (or Under-Bump Metallurgies (if formed, not shown)), and then reflowing the solder balls. In alternative embodiments, the formation of the electrical connectors 190 includes performing a plating step to form solder regions over the RDLs 150, and then reflowing the solder regions. The electrical connectors 190 may also include metal pillars, or metal pillars and solder caps, which may also be formed through plating. Throughout the description, the combined structure including the devices dies 130, the TIVs 120, the molding material 135, the overlying RDLs 150 and dielectric layers 140, the electrical connectors 190, and the buffer layer 110 is referred to as a TIV package 100, which may be a composite wafer.

Next, the TIV package 100 is de-bonded from the carrier C. The adhesive layer A is also cleaned from the TIV package 100. As a result of the removal of the adhesive layer A, the buffer layer 110 is exposed. In some embodiments, the TIV package 100 may warp in shape after being de-bonded from the carrier C. Then, referring to FIG. 12, the TIV package 100 is further adhered to a dicing tape 200, in which the electrical connectors 190 face toward, and may contact, the dicing tape 200. In some embodiments, a laminating film (not shown) is placed onto the exposed buffer layer 110, in which the laminating film may include SR, ABF, backside coating tape, or the like. In alternative embodiments, no laminating film is placed over the buffer layer 110.

Figure 12:
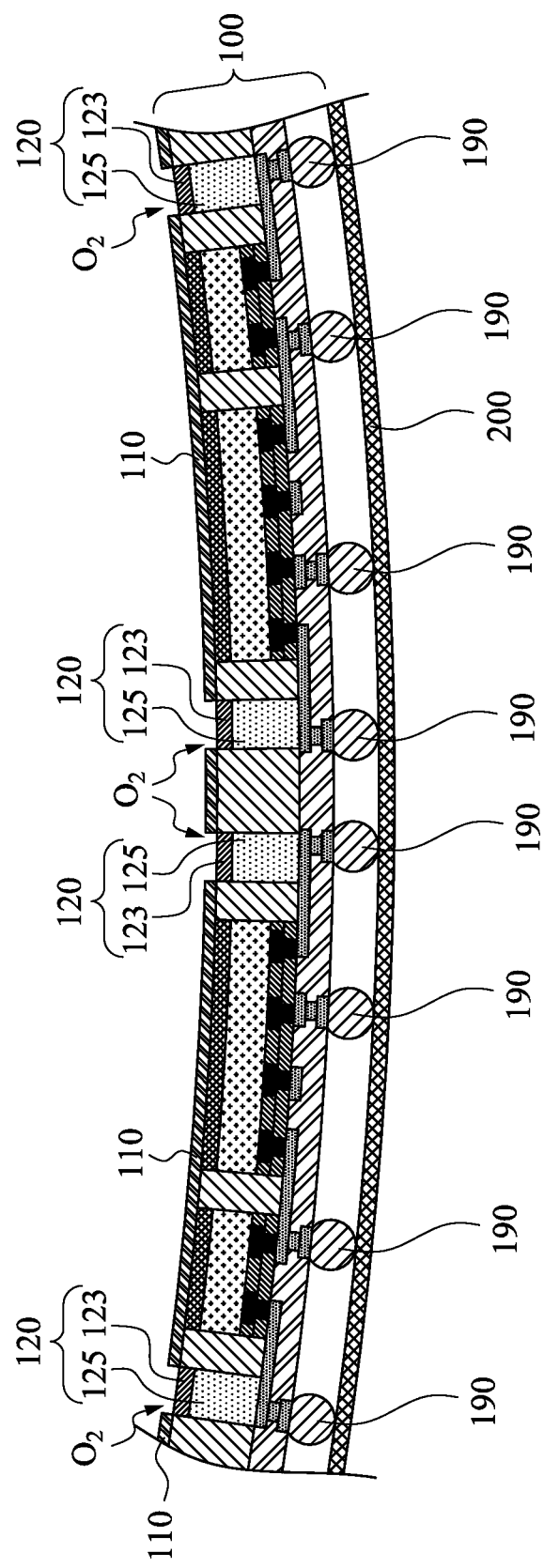

In additions, as shown in FIG. 12, openings $O_2$ are formed in the buffer layer 110. In accordance with some embodiments, the openings $O_2$ are formed through laser drill, although photolithography processes may also be used. The TIVs 120 are exposed through the opening $O_2$. In the embodiments in which the seed layer 123 (FIG. 2) includes the titanium layer, an etch step is carried out to remove the titanium layer, so that the copper layer of the seed layer 123 is exposed. Otherwise, if the seed layer 123 does not include the titanium layer, the etch step is skipped.

Figure 13:
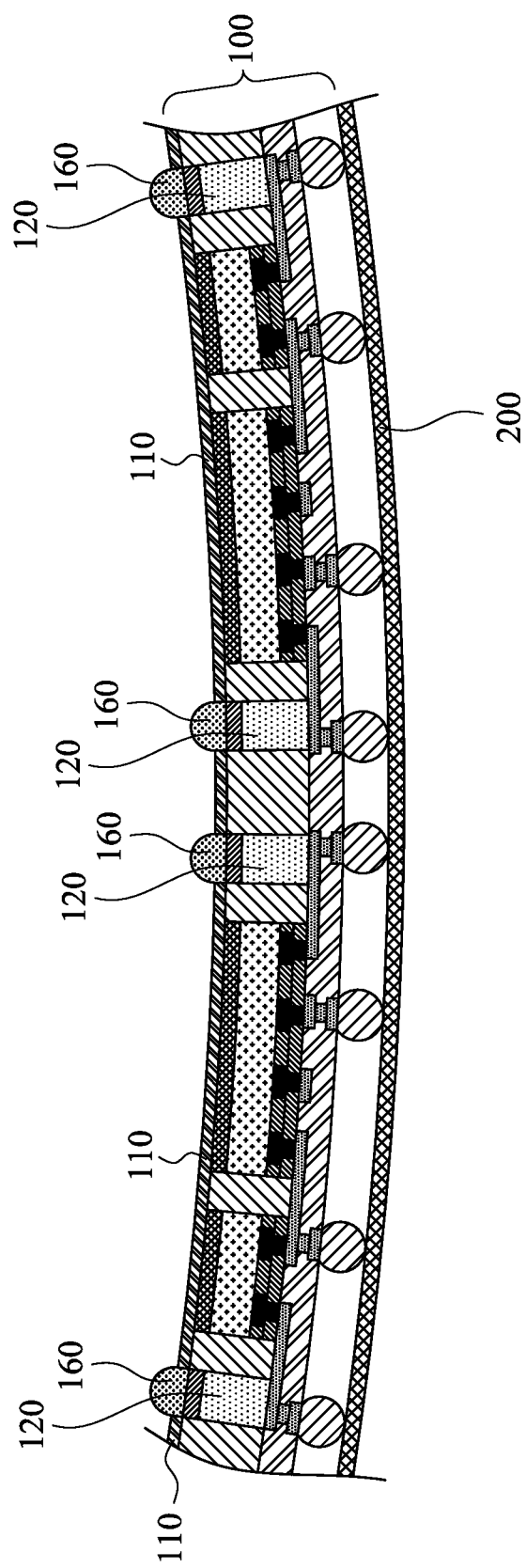

Next, referring to FIG. 13, electrical connectors 160 are formed on the exposed TIVs 120. Formation of the electrical connectors 160 may include printing solder paste onto top surfaces of the exposed TIVs 120. In some embodiments, the solder paste includes solder alloy, flux, solvent, at least one surfactant, and at least one antioxidant. The solder alloy is a combination of metals that can be melted and used to join two metal surfaces. The flux creates a wettable surface for the solder alloy by removing oxides and other contaminants from the metal to be joined. The solvent prevents the flux from sublimating or polymerizing when the solder paste is heated. The surfactant reduces the surface tension at the interface between the solder paste and the metal to be joined to further promote wetting of the solder alloy. The antioxidant prevents reoxidation of the surface of the metal to be joined after the flux has prepared the surface of the metal to be joined for soldering.

The solder paste may be printed on the exposed TIVs 120 with a stencil printer. A stencil is a metal sheet that has laser-cut or chemically etched apertures that match the exposed TIVs 120. The stencil printer has two squeegees: one for a forward stroke and another for a reverse stroke. During printing, the solder paste is rolled in front of a squeegee to fill the apertures in the stencil. Then, the squeegee moves over the stencil and shears off the solder paste in the apertures. The pressure generated by the squeegee injects the solder paste into the apertures and onto the exposed TIVs 120.

Figure 14:
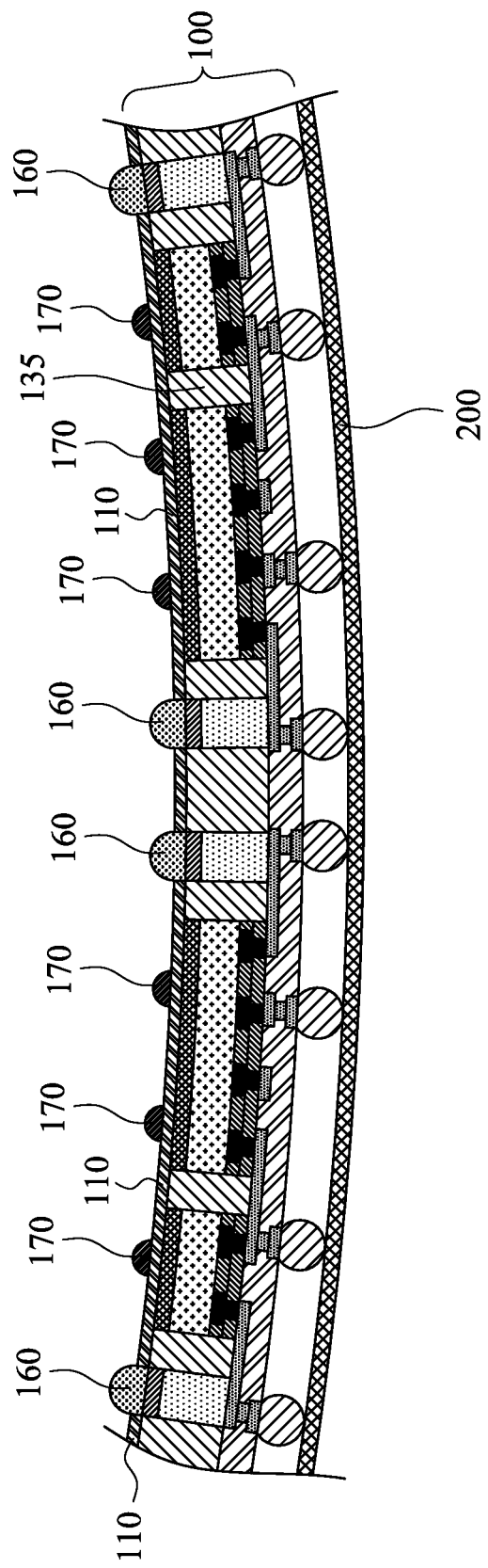

FIG. 14 illustrates formation of dummy structures 170 on the TIV package 100. In some embodiments, the dummy structures 170 are formed on the buffer layer 110 of the TIV package 100. After the formation of the dummy structures 170, the buffer layer 110 is present between the dummy structures 170 and the molding material 135. The formation of the dummy structures 170 may include printing a dielectric material onto a top surface of the buffer layer 110 of the TIV package 100. In some embodiments, the dielectric material may be printed on the buffer layer 110 with the stencil printer as well. As shown in FIG. 14, the dummy structures 170 are separate from the electrical connectors 160, and the dummy structures 170 are separate from each other as well.

In some embodiments, the dummy structures 170 include a dielectric material, such as epoxy flux, epoxy resin, polybenzoxazole (PBO), or other polymer-based materials. The epoxy flux includes a flux component and an epoxy component. The flux component may include at least one activator, solvent, and/or at least one additive. In some embodiments, the flux component may include zinc chloride, ammonium chloride, hydrochloric acid, phosphoric acid, or hydrobromic acid, as examples. The epoxy component may include polyepoxide, as an example. The epoxy component may include a similar material or the same material used for the molding material 135, for example. In some embodiments, the dummy structures 170 are formed after the formation of the electrical connectors 160. In alternative embodiments, the dummy structures 170 are formed before the formation of the electrical connectors 160.

Figure 15:
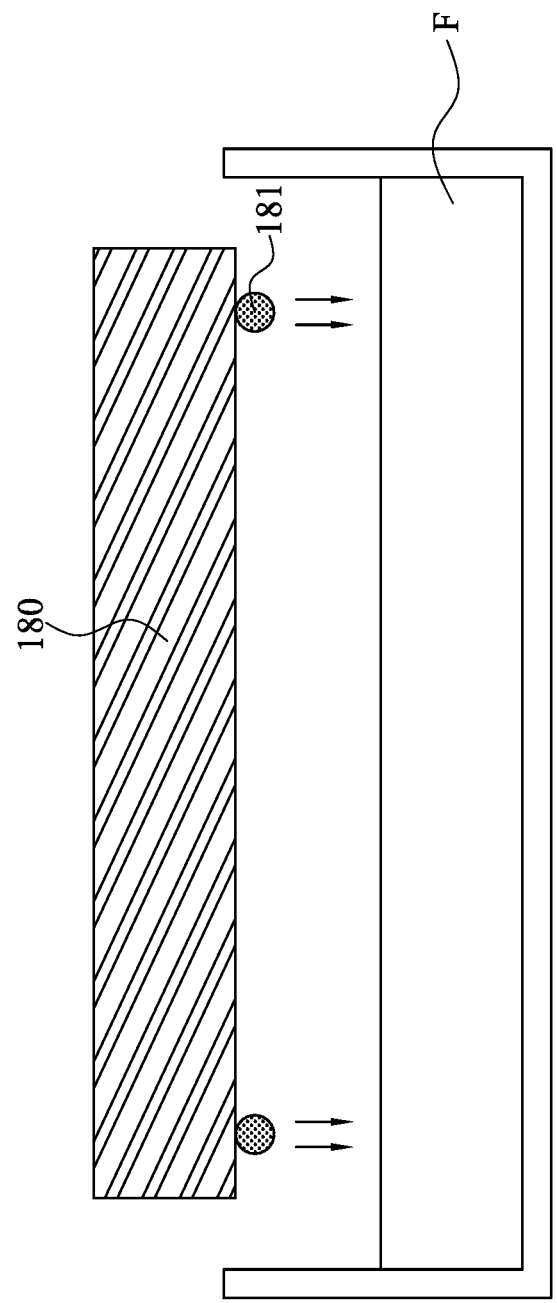

Next, referring to FIG. 15, flux F is applied to external connectors 181 of at least one device package 180. In some embodiments, the external connectors 181 of the device package 180 are dipped in the flux F, such that the flux F is applied to the external connectors 181 of the device package 180. In some exemplary embodiments, the device package 180 may be a memory device, such as a dynamic random access memory (DRAM). In some embodiments, the external connectors 181 of the device package 180 are, for example, solder balls applied to the bottom of the device package 180.

Figure 16:
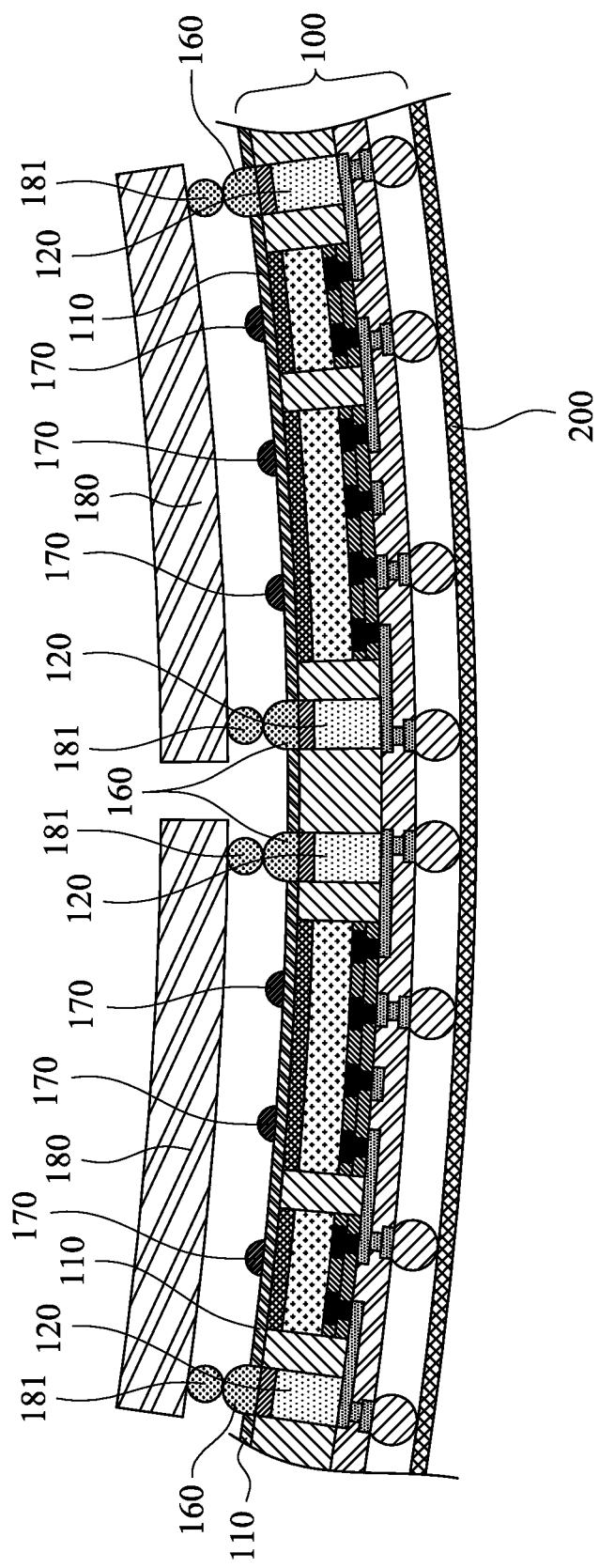

Next, referring to FIG. 16, a plurality of the device packages 180 are attached to the TIV package 100. The external connectors 181 of the device packages 180 are attached to the electrical connectors 160. To be more specific, the device packages 180 are disposed over the TIV package 100 with the external connectors 181 of the device packages 180 on the corresponding electrical connectors 160.

Figure 17:
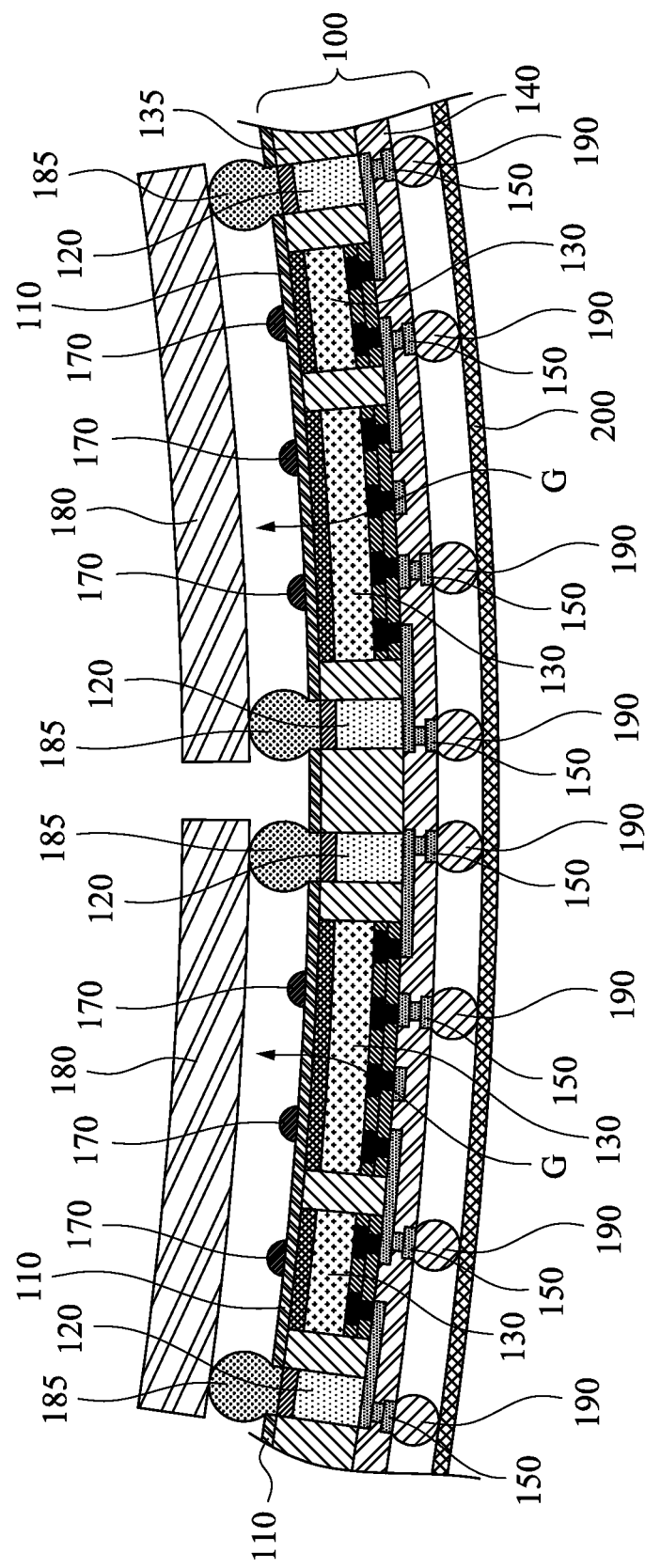

Next, the external connectors 181 and the corresponding electrical connectors 160 are reflowed. Heat is applied at least to the external connectors 181 and the electrical connectors 160, such that the external connectors 181 and the electrical connectors 160 are melted. Then, the external connectors 181 and the electrical connectors 160 solidify as they cool, such that the external connectors 181 and the corresponding electrical connectors 160 are jointed to form electrical joints 185 (FIG. 17). The resulting structure is shown in FIG. 17. In some embodiments, at least one or each of the electrical joints 185 has an at least partially convex surface. Furthermore, the heat may also be applied to the dummy structures 170 to cure the dummy structures 170. In some embodiments, at least one or each of the cured dummy structures 170 has an at least partially convex surface as well.

In some embodiments, the dummy structures 170 are electrically non-conducting to the electrical joints 185. Furthermore, since the dummy structures 170 are electrically non-conducting to the electrical joints 185, the dummy structures 170 are also electrically non-conducting to the TIVs 120, the device dies 130, the RDLs 150, and the device package 180. In other words, the dummy structures 170 are electrically non-conducting to any other portion of the TIV package 100 and the device package 180.

As shown in FIG. 17, gaps G are formed between the device packages 180 and the TIV package 100, and the dummy structures 170 are present in the gaps G. With the presence of the dummy structures 170 in the gaps G, space in the gaps G between the device packages 180 and the TIV package 100 is reduced. In some embodiments, the dummy structures 170 are structurally lower than the electrical joints 185. Therefore, the chance that the dummy structures 170 hinder the bonding between the TIV package 100 and the device packages 180 is avoided. In some embodiments, the top surfaces of the dummy structures 170 are not in contact with the bottom surfaces of the device packages 180. In alternative embodiments, the top surface of at least one of the dummy structures 170 is in contact with the bottom surface of at least one of the device packages 180 because of warpage of the device packages 180 and the TIV package 100.

Figure 18:
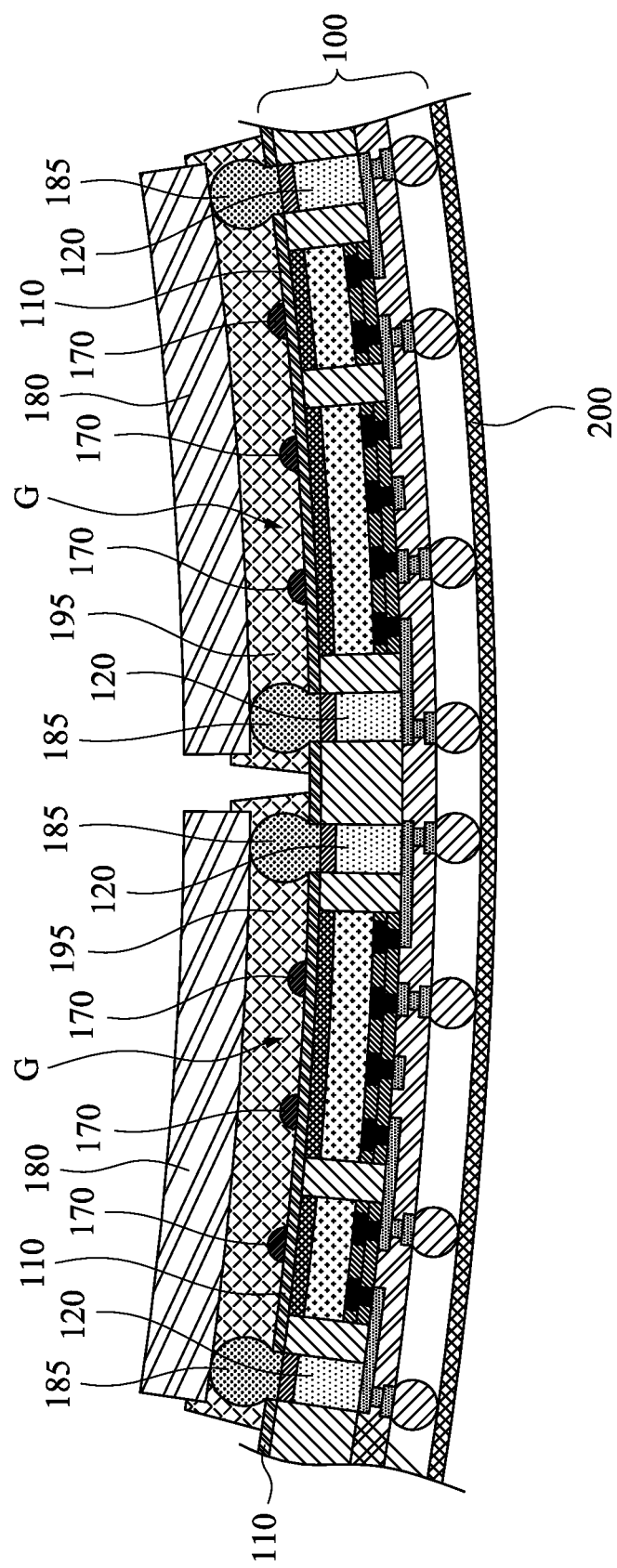

FIG. 18 illustrates dispensing of underfills 195 respectively into the gaps G between the device packages 180 and the TIV package 100. The underfills 195 fill gaps between the electrical joints 185 and the dummy structures 170, and may be in contact with the buffer layer 110 and the device packages 180. Since the space in the gaps G is reduced because of the presence of the dummy structures 170, the capillarities of the underfills 195 in the form of fluid in the gaps G are facilitated. Thus, the underfills 195 in the form of fluid fill up the gaps G, and the void ratios of the underfills 195 in the gaps G are correspondingly reduced. Next, the underfills 195 may be cured to turn the underfills 195 into solid materials, for example, through a thermal process.

Figure 19:
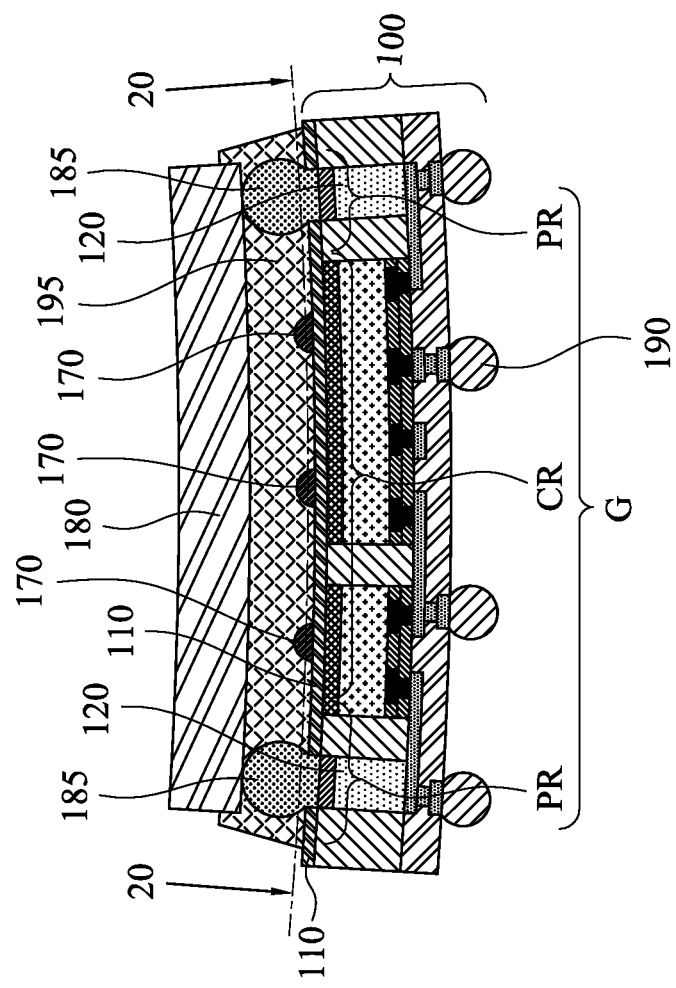
Figure 20:
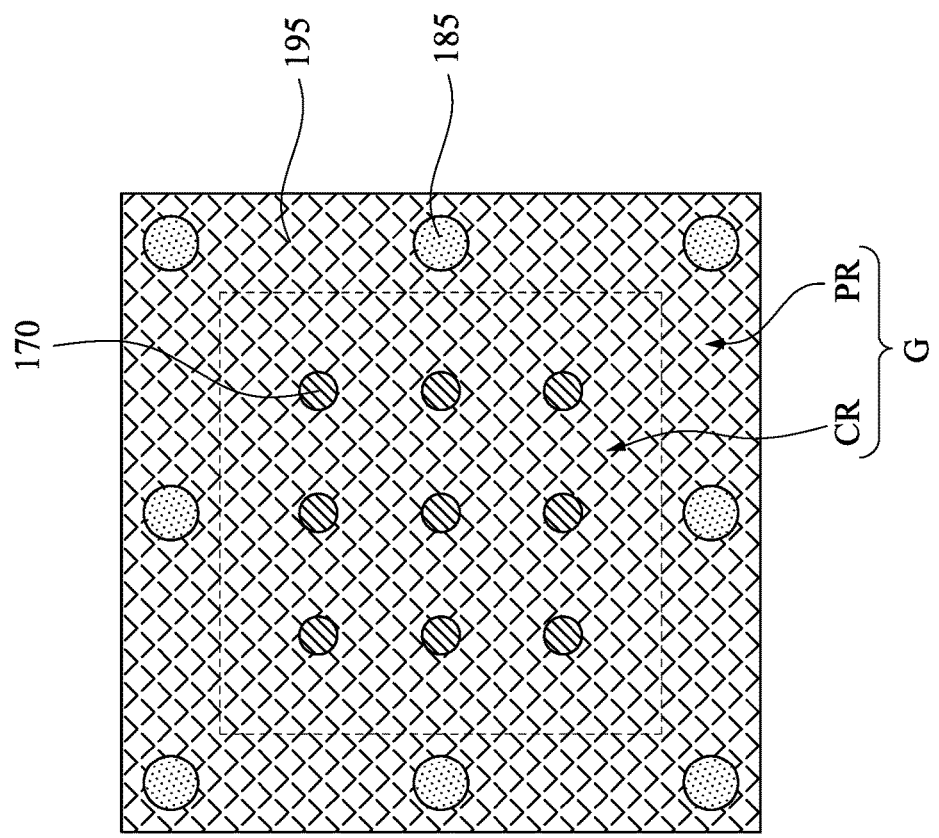

Next, a singulation process is carried out to saw the TIV package 100, such that a plurality of package structures 101 is formed. The resulting structure of one of the package structures 101 is shown in FIG. 19. In addition, since the void ratios of the underfills 195 in the gaps G are reduced as mentioned above, the overall structural strength of each of the package structures 101 is improved. As shown in FIG. 19, the gap G between the device package 180 and the TIV package 100 has a central region CR and a periphery region PR, in which the central region CR is surrounded by the periphery region PR. FIG. 20 is a sectional view taken along the line 20-20 of FIG. 19. Referring to FIG. 20, the dummy structures 170 are present in the central region CR, and the electrical joints 185 are present in the periphery region PR. This means that the dummy structures 170 are surrounded by the electrical joints 185.

Figure 21:
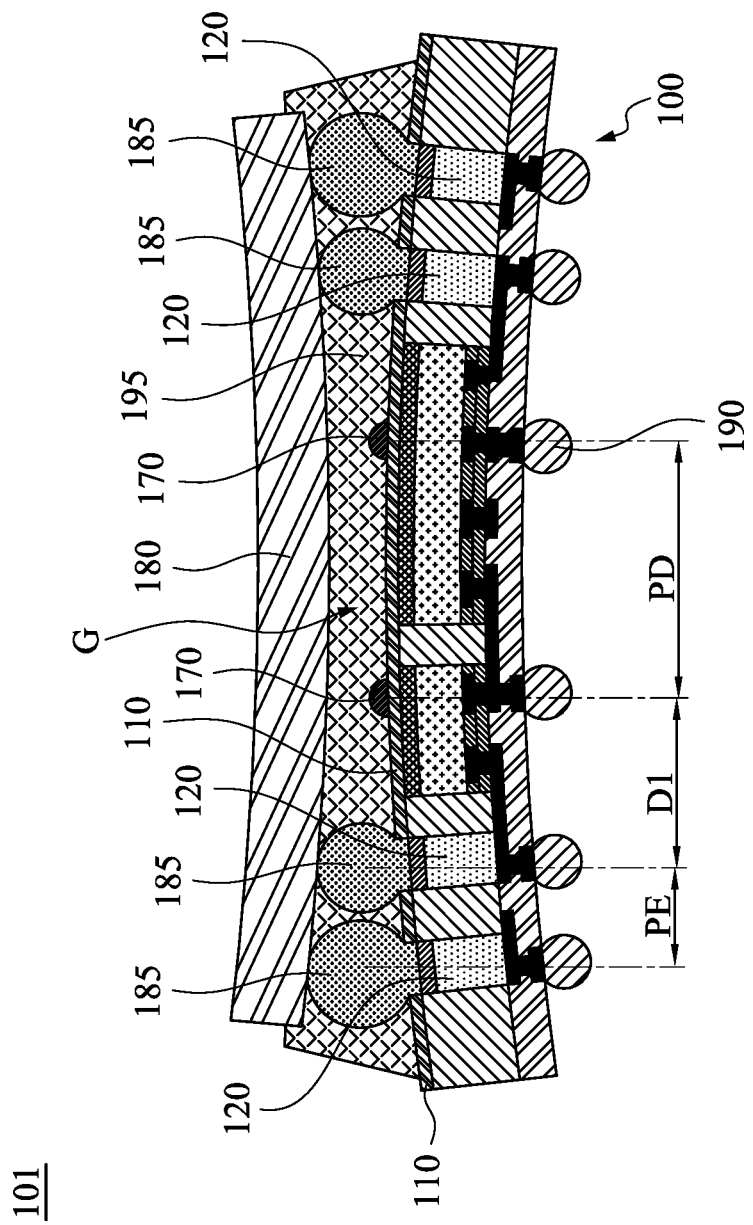
FIG. 21 is a schematic view of a package structure in accordance with some other embodiments of the present disclosure.

Reference is made to FIG. 21. FIG. 21 is a schematic view of a package structure 101 in accordance with some embodiments of the present disclosure. In some embodiments, as shown in FIG. 21, the device package 180 warps upwards, and the TIV package 100 warps downwards. That is, the device package 180 and the TIV package 100 warp in different directions. In the embodiments as shown in FIG. 21, a distance D1 between one of the electrical joints 185 and one of the dummy structures 170 adjacent to each other is in a ratio of about 0.5 to about 4 relative to a pitch PE between adjacent electrical joints 185; and a pitch PD between adjacent dummy structures 170 is also in a ratio of about 0.5 to about 4 relative to the pitch PE between adjacent electrical joints 185. Through such a configuration, bridges between the electrical joints 185 and the dummy structures 170 can be avoided.

Figure 22:
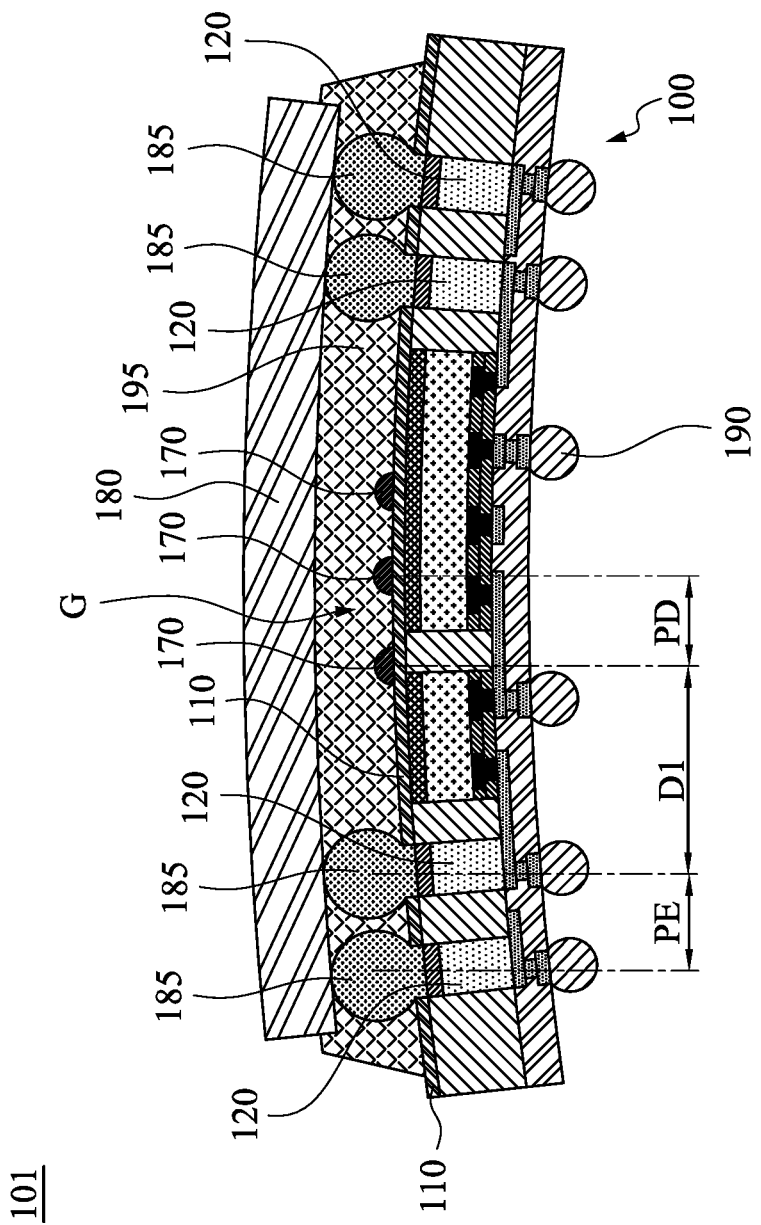
FIG. 22 is a schematic view of a package structure in accordance with some other embodiments of the present disclosure.

Reference is made to FIG. 22. FIG. 22 is a schematic view of a package structure 101 in accordance with some embodiments of the present disclosure. In some embodiments, as shown in FIG. 22, the device package 180 warps downwards, and the TIV package 100 warps downwards. That is, the device package 180 and the TIV package 100 warp in substantially the same direction. In the embodiments as shown in FIG. 22, the distance D1 between one of the electrical joints 185 and one of the dummy structures 170 adjacent to each other is in a ratio of about 0.5 to about 4 relative to the pitch PE between adjacent electrical joints 185; and a pitch PD between adjacent dummy structures 170 is also in a ratio of about 0.5 to about 4 relative to the pitch PE between adjacent electrical joints 185. Through such a configuration, bridges between the electrical joints 185 and the dummy structures 170 can be avoided.

Figure 23:
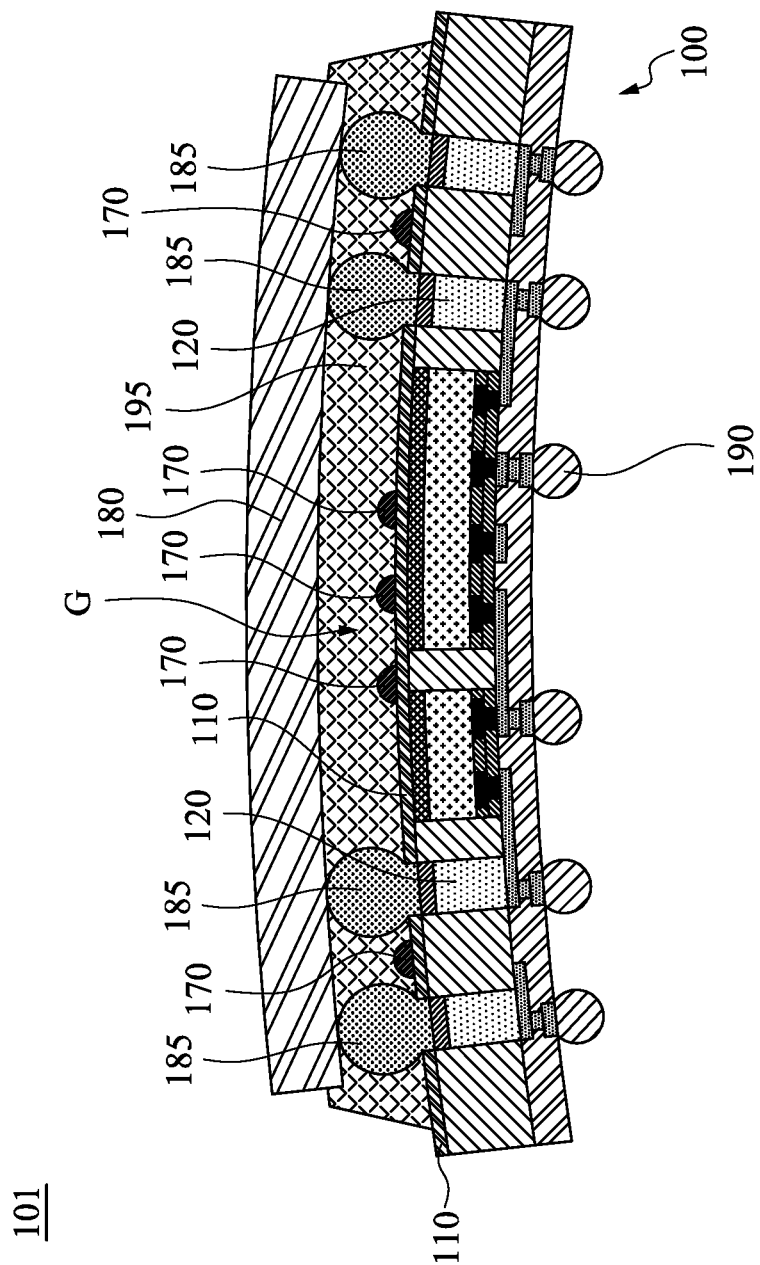
FIG. 23 is a schematic view of a package structure in accordance with some other embodiments of the present disclosure.

Reference is made to FIG. 23. FIG. 23 is a schematic view of a package structure 101 in accordance with some embodiments of the present disclosure. In some embodiments, as shown in FIG. 23, at least one of the dummy structures 170 is present in the periphery region PR and between the adjacent electrical joints 185.

According to various embodiments of the present disclosure, since spaces in the gap between the device packages and the TIV packages are reduced because of the presence of the dummy structures, the capillarities of the underfills in the form of fluid in the gaps are facilitated. Thus, the underfills in the form of fluid fill up the gaps, and the void ratios of the underfills in the gaps are correspondingly reduced. In addition, since the void ratios of the underfills in the gaps are reduced, the overall structural strength of each of the package structures is improved.

According to various embodiments of the present disclosure, the package structure includes the molding material, at least one through-via, at least one conductor, at least one dummy structure and the underfill. The through-via extends through the molding material. The conductor is present on the through-via. The dummy structure is present on the molding material and includes the dielectric material. The underfill is at least partially present between the conductor and the dummy structure.

According to various embodiments of the present disclosure, the packing structure includes the first package, the second package, at least one electrical joint, at least one dummy structure and the underfill. The second package is over the first package, in which the first package and the second package have a gap therebetween. The electrical joint is present in the gap and electrically connects the first package and the second package. The dummy structure is present in the gap. The underfill is present in the gap.

According to various embodiments of the present disclosure, the method for manufacturing the package structure is provided. The method includes forming at least one conductor and at least one dummy structure on the first package, in which the conductor is electrically connected to at least one electrically conductive feature of the first package, bonding the second package to the first package with the conductor electrically connecting the electrically conductive feature of the first package and at least one electrically conductive feature of the second package, in which after the bonding, the gap is formed between the first package and the second package, and the dummy structure is present in the gap, and dispensing the underfill into the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
  a molding material;
  at least one through-via extending through the molding material;
  at least one conductor present on the through-via;
  at least one dummy structure present on the molding material, the dummy structure and the conductor having different materials; and
  an underfill at least partially present between the conductor and the dummy structure.

2. The package structure of claim 1, wherein the dummy structure is surrounded by a plurality of the conductors.

3. The package structure of claim 1, further comprising:
  a buffer layer present between the molding material and the dummy structure.

4. The package structure of claim 1, wherein the conductor comprises solder.

5. The package structure of claim 1, wherein a plurality of the dummy structures are present on the molding material and are separate from each other.

6. A package structure, comprising:
  a first package;

a second package over the first package, wherein the first package and the second package have a gap therebetween;

at least one electrical joint present in the gap and electrically connecting the first package and the second package;

at least one dummy structure present in the gap; and an underfill present in the gap and further in between the dummy structure and the second package.

7. The package structure of claim 6, wherein the dummy structure comprises a dielectric material.

8. The package structure of claim 6, wherein the dummy structure has an at least partially convex surface.

9. The package structure of claim 6, wherein the electrical joint has an at least partially convex surface.

10. The package structure of claim 6, wherein the dummy structure is lower than the electrical joint.

11. The package structure of claim 6, wherein the dummy structure is separate from the electrical joint.

12. The package structure of claim 6, wherein the gap has a periphery region and a central region surrounded by the periphery region, the dummy structure is present in the central region, and the electrical joint is present in the periphery region.

13. The package structure of claim 6, wherein the underfill is at least partially present between a plurality of the dummy structures.

14. The package structure of claim 6, wherein the first package has a molding material and a through-via extending through the molding material, and the electrical joint is electrically connected to the through-via.

15. The package structure of claim 6, wherein the second package is a dynamic random access memory (DRAM).

16. The package structure of claim 6, wherein a distance between one of a plurality of the electrical joints and one of a plurality of the dummy structures adjacent to each other is in a ratio of about 0.5 to about 4 relative to a pitch between adjacent two of the electrical joints.

17. The package structure of claim 6, wherein a first pitch between adjacent two of a plurality of the dummy structures is in a ratio of about 0.5 to about 4 relative to a second pitch between adjacent two of a plurality of the electrical joints.

18. A package structure, comprising:

a first package;

a second package over the first package;

a plurality of electrical joints between the first package and the second package;

a protrusion structure over the first package and between the electrical joints, the protrusion structure being electrically isolated from the first package; and an underfill encapsulating the electrical joints and the protrusion structure, wherein the underfill is in contact with a top of the protrusion structure.

19. The package structure of claim 18, wherein the protrusion structure has a different geometry than the electrical joints.

20. The package structure of claim 1, wherein the dummy structure includes a dielectric material.

* * * * *